(12) United States Patent
Stingu et al.

(10) Patent No.: US 11,881,720 B2
(45) Date of Patent: Jan. 23, 2024

(54) ELECTRONIC DEVICE, WIRELESS CHARGER AND WIRELESS CHARGING SYSTEM

(71) Applicant: Spark Connected LLC, Dallas, TX (US)

(72) Inventors: Petru Emanuel Stingu, Dallas, TX (US); Kenneth Moore, Dallas, TX (US); Yulong Hou, Farmers Branch, TX (US); Ruwanga Dassanayake, Dallas, TX (US)

(73) Assignee: Spark Connected LLC, Dallas, TX (US)

( * ) Notice: Subject to any disclaimer, the term of this patent is extended or adjusted under 35 U.S.C. 154(b) by 616 days.

(21) Appl. No.: 17/020,546

(22) Filed: Sep. 14, 2020

(65) Prior Publication Data

US 2021/0083509 A1    Mar. 18, 2021

Related U.S. Application Data

(60) Provisional application No. 62/899,607, filed on Sep. 12, 2019.

(51) Int. Cl.
*A47B 21/06* (2006.01)
*G06F 1/18* (2006.01)
(Continued)

(52) U.S. Cl.
CPC .............. *H02J 50/12* (2016.02); *A47B 21/06* (2013.01); *G01R 33/0094* (2013.01);
(Continued)

(58) Field of Classification Search
CPC .......... H02J 50/12; H02J 50/005; H02J 50/10; H02J 50/60; H02J 50/80; H02J 50/402; A47B 21/06; A47B 2021/066; A47B 2200/008; G01R 33/0094; G01R 33/0206; G01R 33/07; G01R 33/10; G06F 1/189; G06F 1/1632; G06F 1/1656;
(Continued)

(56) References Cited

U.S. PATENT DOCUMENTS 3,376,578 A    4/1968 Sawyer
3,735,231 A    5/1973 Sawyer
(Continued)

OTHER PUBLICATIONS

Consumer Reports, "Wireless charging pad review We tested four popular pads to see whether they really make your life easier", Wireless Charging Pad Reviews, Dec. 11, 2013, 5 pages.
(Continued)

*Primary Examiner* — Stacy Whitmore
(74) *Attorney, Agent, or Firm* — Slater Matsil, LLP

(57) ABSTRACT

An electronic device, a wireless charger and a wireless charging system are disclosed. In an embodiment an electronic device includes a metal housing including electronic components of the electronic device, a recess in the metal housing, a receiver coil configured to receive wireless power, the receiver coil located in the recess outside of the metal housing and a holding structure for the receiver coil, wherein the holding structure comprises a material with a high magnetic permeability, and wherein the receiver coil is electrically connected to the electronic components inside the metal housing.

10 Claims, 6 Drawing Sheets

(51) Int. Cl.
| | |
|---|---|
| *H02J 50/12* | (2016.01) |
| *H02M 3/158* | (2006.01) |
| *H02J 50/80* | (2016.01) |
| *H02J 50/10* | (2016.01) |
| *H02J 50/00* | (2016.01) |
| *H02J 50/60* | (2016.01) |
| *G01R 33/00* | (2006.01) |
| *G01R 33/02* | (2006.01) |
| *G01R 33/07* | (2006.01) |
| *G01R 33/10* | (2006.01) |

(52) U.S. Cl.
CPC ......... *G01R 33/0206* (2013.01); *G01R 33/07* (2013.01); *G01R 33/10* (2013.01); *G06F 1/189* (2013.01); *H02J 50/005* (2020.01); *H02J 50/10* (2016.02); *H02J 50/60* (2016.02); *H02J 50/80* (2016.02); *H02M 3/1582* (2013.01); *A47B 2021/066* (2013.01); *A47B 2200/008* (2013.01)

(58) Field of Classification Search
CPC ...... G06F 1/1698; G06F 1/263; G06F 1/1635; H02M 3/1582; H02M 3/285; H02M 3/33584
See application file for complete search history.

(56) References Cited

U.S. PATENT DOCUMENTS

| | | | |
|---|---|---|---|
| 4,860,183 A | 8/1989 | Maeda et al. | |
| 5,434,504 A | 7/1995 | Hollis et al. | |
| 5,498,948 A | 3/1996 | Bruni et al. | |
| 6,175,169 B1 | 1/2001 | Hollis, Jr. et al. | |
| 6,184,651 B1 | 2/2001 | Fernandez et al. | |
| 6,445,093 B1 | 9/2002 | Binnard | |
| 6,803,744 B1 | 10/2004 | Sabo | |
| 6,949,845 B2 | 9/2005 | Disugi et al. | |
| 8,049,370 B2 | 11/2011 | Azancot et al. | |
| 8,193,769 B2 * | 6/2012 | Azancot | H02J 50/40 320/108 |
| 8,957,549 B2 | 2/2015 | Kesler et al. | |
| 9,590,444 B2 | 3/2017 | Walley et al. | |
| 9,800,191 B2 | 10/2017 | Barsilai et al. | |
| 9,853,441 B2 | 12/2017 | Teggatz et al. | |
| 10,054,622 B2 | 8/2018 | Hernandez et al. | |
| 10,079,090 B2 | 9/2018 | Teggatz et al. | |
| 10,168,443 B2 | 1/2019 | Mangano et al. | |
| 11,005,296 B2 * | 5/2021 | Kanno | H02J 50/80 |
| 2006/0061323 A1 | 3/2006 | Cheng et al. | |
| 2010/0171369 A1 | 7/2010 | Baarman et al. | |
| 2010/0181841 A1 | 7/2010 | Azancot et al. | |
| 2010/0219183 A1 | 9/2010 | Azancot et al. | |
| 2010/0244579 A1 | 9/2010 | Sogabe et al. | |
| 2011/0050164 A1 | 3/2011 | Partovi et al. | |
| 2011/0062793 A1 | 3/2011 | Azancot et al. | |
| 2011/0074344 A1 | 3/2011 | Park et al. | |
| 2011/0121660 A1 | 5/2011 | Azancot et al. | |
| 2011/0227527 A1 | 9/2011 | Zhu et al. | |
| 2012/0032632 A1 | 2/2012 | Soar | |
| 2013/0049484 A1 | 2/2013 | Weissentern et al. | |
| 2013/0082651 A1 | 4/2013 | Park et al. | |
| 2013/0257165 A1 | 10/2013 | Singh | |
| 2013/0257172 A1 | 10/2013 | Teggatz et al. | |
| 2013/0264973 A1 | 10/2013 | Garg et al. | |
| 2013/0285601 A1 | 10/2013 | Sookprasong et al. | |
| 2013/0300204 A1 | 11/2013 | Partovi | |
| 2014/0080409 A1 | 3/2014 | Frankland et al. | |
| 2014/0084857 A1 | 3/2014 | Liu et al. | |
| 2014/0111154 A1 | 4/2014 | Roy et al. | |
| 2014/0184150 A1 | 7/2014 | Walley | |
| 2015/0001951 A1 * | 1/2015 | Park | H02J 50/10 336/200 |
| 2015/0115877 A1 | 4/2015 | Arai et al. | |
| 2015/0142348 A1 | 5/2015 | Huang et al. | |
| 2015/0249484 A1 | 9/2015 | Mach et al. | |
| 2015/0295447 A1 * | 10/2015 | Nitz | H02J 7/02 320/103 |
| 2015/0341087 A1 | 11/2015 | Moore et al. | |
| 2016/0149440 A1 | 5/2016 | Staring et al. | |
| 2016/0181818 A1 | 6/2016 | Joye et al. | |
| 2016/0309418 A1 | 10/2016 | Sedzin et al. | |
| 2016/0344224 A1 * | 11/2016 | Hong | H02J 50/90 |
| 2017/0163100 A1 | 6/2017 | Vocke et al. | |
| 2017/0222485 A1 | 8/2017 | Covic et al. | |
| 2017/0288412 A1 | 10/2017 | Yamamoto et al. | |
| 2018/0137971 A1 * | 5/2018 | Jang | H01Q 7/06 |
| 2018/0197678 A1 | 7/2018 | Uchida et al. | |
| 2018/0301942 A1 | 10/2018 | Brohlin et al. | |
| 2018/0316210 A1 * | 11/2018 | Rittenhouse | G06F 1/1681 |
| 2019/0068001 A1 | 2/2019 | Lovas et al. | |
| 2019/0084433 A1 | 3/2019 | Wang et al. | |
| 2019/0109498 A1 | 4/2019 | Stingu et al. | |
| 2019/0190320 A1 | 6/2019 | Park | |
| 2019/0207422 A1 * | 7/2019 | Dani | A24F 40/90 |
| 2019/0214842 A1 | 7/2019 | Wheeland et al. | |
| 2019/0312466 A1 | 10/2019 | Mynar et al. | |
| 2019/0319494 A1 | 10/2019 | Park et al. | |
| 2019/0334388 A1 | 10/2019 | Van Wageningen et al. | |
| 2020/0144862 A1 * | 5/2020 | Zaitsu | H02J 7/00045 |
| 2020/0169124 A1 | 5/2020 | Mehas et al. | |
| 2020/0395793 A1 | 12/2020 | Ettes et al. | |
| 2021/0203190 A1 * | 7/2021 | Rittenhouse | G06F 1/1632 |
| 2022/0026962 A1 * | 1/2022 | Ap | H01P 3/08 |
| 2022/0202079 A1 * | 6/2022 | McGuinness | H02J 50/80 |
| 2022/0224166 A1 | 7/2022 | Sato | |
| 2022/0285992 A1 * | 9/2022 | Furiya | H02J 50/005 |

OTHER PUBLICATIONS

Digi-Key Electronics, "Inductive Versus Resonant Wireless Charging: A Truce May Be a Designer's Best Choice", Aug. 2, 2016, 8 pages.
Gao, Xiang, "Demodulating Communication Signals of Qi-Compliant Low-Power Wireless Charger Using MC56F8006 DSC", NXP Freescale Semiconductor Application Note, Document No. AN4701, Rev. 0, Mar. 2013, 21 pages.
Jansen, J. W., et al., "Overview of analytical models for the design of linear and planar motors", TU/e Eindhoven University of Technology, DOI: 10.1109/TMAG/2014.2328556, Jan. 1, 2014, 8 pages.
Johns, Bill et al., "Adapting Qi-compliant wireless-power solutions to low-power wearable products", Texas Instruments, High-Performance Analog Products, 2Q, 2014, Analog Applications Journal, 7 pages.
Kot, Thomas, "LC Sensor Rotation Detection with MSP430 Extended Scan Interface (ESI)", Texas Instruments, Application Report, SLAA639, Jul. 2014, 33 pages.
Lynch, Brian T., "Under the Hood of a DC/DC Boost Converter", Texas Instruments, Texas Instruments, Power Supply Design Seminar, Paper SEM1800, Dallas, TX, USA, 2008-2009, 26 pages.
Rice, John, "Examining Wireless Power Transfer", Texas Instruments, 2014/2015 Power Supply Design Seminar, 38 pages.
Texas Instruments "Industry-Leading Wireless Power Solutions—The Most Widely Adopted in the Market", ti.com/wirelesspower, SLYT485C, 3 pages.
Texas Instruments, "Introduction to Wireless Power", QI WPC 1.1 compliant, www.ti.com/wirelesspower, 49 pages.
Waters, Benjamin et al., "Optimal Coil Size Ratios for Wireless Power Transfer Applications", IEEE International Symposium on Circuits and Systems (ISCAS), Jun. 1-5, 2014, 4 pages.
Wikipedia, "Electromagnetic coil", https://en.wikipedia.org/w/index.php?title=Electromagnetic_coil&oldid=776415501, Apr. 2017, 6 pages.
Wikipedia, "Inductive charging", https://en.wikipedia.org/w/index.php?title=Inductive_charging&oldid=802615270, Sep. 2017, 7 pages.
Wikipedia, "Qi (standard)", https://en.wikipedia.org/w/index.php?title=Qi_(standard)&oldid=803427516, Oct. 2017, 5 pages.

(56) References Cited

OTHER PUBLICATIONS

Zens, "Zens First Worldwide to Introduce Built-in Wireless (Sub-)Surface Charger with Apple and Samsung Fast Charge", Jan. 24, 2019, 5 pages.
MacMillan Dictionary, "Definition of Associated," https://www.macmillandictionary.com/us/dictionary/american/be-associated-with#:-:text=to%20be%20connected20%20with%20something%20in%20some%20way.

* cited by examiner

PRIOR ART

United States Patent US 11,881,720 B2

ELECTRONIC DEVICE, WIRELESS CHARGER AND WIRELESS CHARGING SYSTEM

CROSS-REFERENCE TO RELATED APPLICATIONS

This application claims the benefit of U.S. Provisional Application No. 62/899,607, entitled "Wireless Charging Circuit and Method," and filed on Sep. 12, 2019, which application is hereby incorporated herein by reference.

This application is filed concurrently with U.S. patent application Ser. No. 17/020,326, U.S. patent application Ser. No. 17/020,537, and U.S. patent application Ser. No. 17/020,494, each of which claiming the benefit of U.S. Provisional Application No. 62/899,607, which applications are hereby incorporated herein by reference.

TECHNICAL FIELD

The present disclosure relates generally to an electronic device, and, in particular embodiments, to an electric device with outside wireless power receiver. The present disclosure further relates to a wireless charger, and, in particular embodiments, to a wireless charger with more than one wireless power transmission coil. The present disclosure also relates to a wireless charging system.

BACKGROUND

Wireless charging systems are becoming ubiquitous in today's society. For example, many smartphones and wearables implement wireless charging technology. Ease of use, greater reliability, spatial freedom, reduced connectors and openings, and the possibility of hermetically sealing are among the benefits offered by wireless charging. Wireless charging standards allow for interoperability between different devices and manufacturers. Some wireless charging standards, such as the Qi standard from the Wireless Power Consortium, are becoming widely adopted.

FIG. 1 shows exemplary wireless charging system 1. Wireless charging system 1 includes a transmitter (TX) device 2 that includes a transmitter coil $L_{TX}$, and a receiver (RX) device 3 that includes a receiver coil $L_{RX}$. The efficiency of the wireless power transmission generally depends on the coupling between the coil $L_{TX}$ and coil $L_{RX}$. The coupling between the coil $L_{TX}$ and coil is generally based on the relative position between the coil $L_{TX}$ and coil $L_{RX}$.

SUMMARY

In accordance with an embodiment, an electronic device includes a metal housing comprising electronic components of the electronic device, a recess in the metal housing, a receiver coil configured to receive wireless power, the receiver coil located in the recess outside of the metal housing and a holding structure for the receiver coil, wherein the holding structure comprises a material with a high magnetic permeability, and wherein the receiver coil is electrically connected to the electronic components inside the metal housing.

In accordance with an embodiment, a wireless charger includes a first concentric coil of a first LC tank, a second concentric coil of a second LC tank, a first driver circuit electrically connected the first LC tank and a second driver circuit electrically connected to the second LC tank, wherein the first driver circuit is independently and separately connected to the first LC tank, wherein the second driver circuit is independently and separately connected to the second LC tank, wherein the first concentric coil is located within the second concentric coil, and wherein the wireless charger is configured to transmit electrical power.

In accordance with an embodiment, a wireless charging system includes a wireless power transmitter comprising a first concentric coil of a first LC tank, a second concentric coil of a second LC tank, a first driver circuit electrically connected the first LC tank and a second driver circuit electrically connected to the second LC tank, wherein the first driver circuit is independently and separately connected to the first LC tank, wherein the second driver circuit is independently and separately connected to the second LC tank, and wherein the first concentric coil is located within the second concentric coil. The wireless charging system further includes a wireless power receiver comprising a coil, wherein the wireless power transmitter is configured to transmit electrical power to the wireless power receiver.

BRIEF DESCRIPTION OF THE DRAWINGS SUMMARY

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments provide an electronic device with a power receiver located outside the housing of the electronic device. The power receiver may be located in recess, e.g., on a side of the electronic device on which the electronic device is typically positioned.

Further embodiments provide a wireless charger having more than one coil, e.g., two, three or more concentric coils. Each of these coils can be individually driven by a driver circuit. Therefore, the overall resulting intensities and magnetic fields can be shaped based on the individually driven concentric coils.

Yet other embodiments provide a charging system or arrangement including an electronic device according to embodiments and a wireless charger according to embodiments.

In some applications, such as in wireless charging for a laptop or a portable device, electromagnetic interference (EMI) is a critical consideration. Some laptops or portable devices include a metallic enclosure, such as an aluminum enclosure, to improve EMI performance or to shield the electronic device from EMI.

Figure 1:
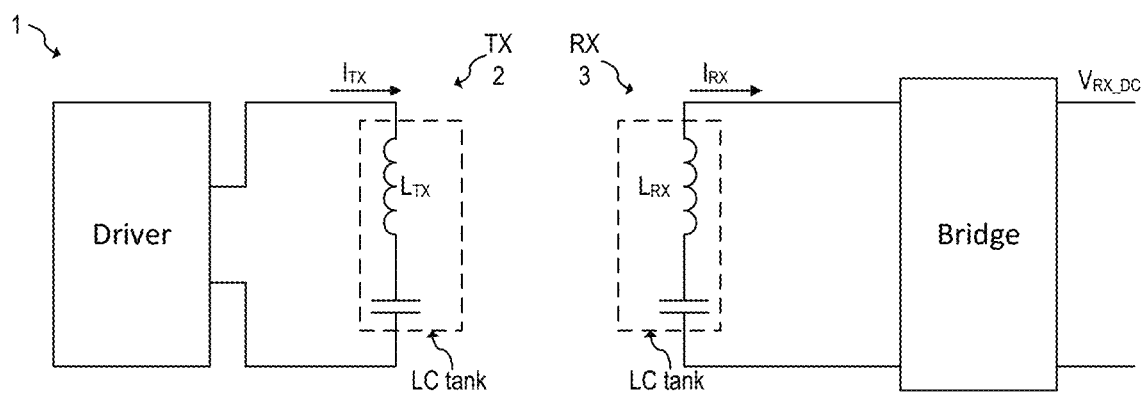
FIG. 1 shows an exemplary wireless charging system.
Figure 2A:
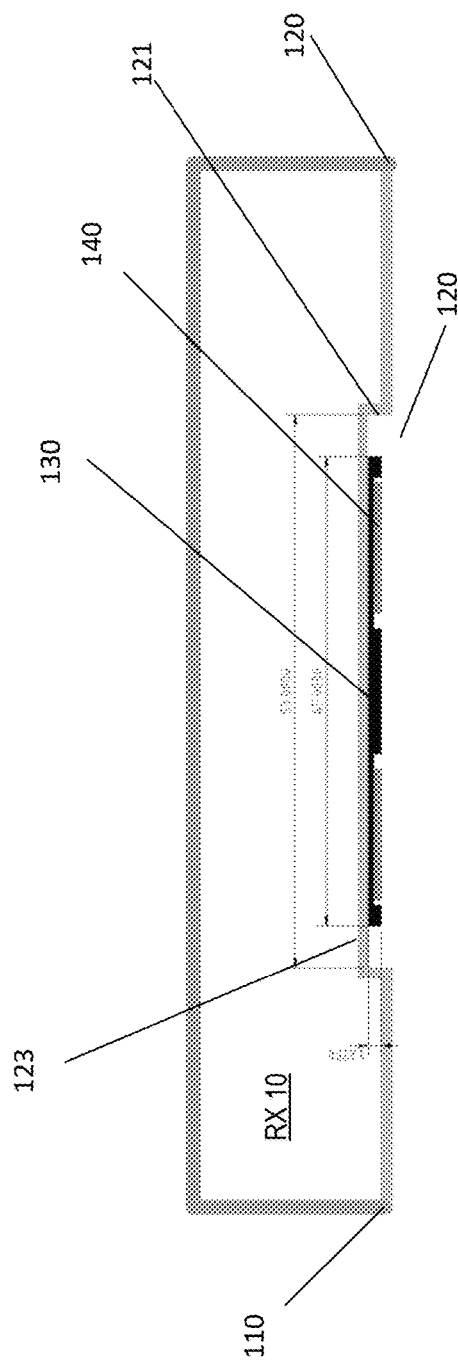
FIG. 2A shows an electronic device with a recess housing a wireless power receiver outside of the housing of the electronic device according to embodiments.

FIG. 2A shows an electronic device 10 such as a laptop with a metallic enclosure (housing) 100 having a recess or pocket 120 in the bottom surface no of the enclosure 100. The metallic enclosure 100 may be made of aluminum. In some embodiments, metals other than aluminum may be used for the enclosure 100, e.g., copper, magnesium or another high conductivity metal.

The bottom surface 110 of the enclosure 100 is the side of the laptop 10 with which the laptop 10 is regularly positioned or placed on a surface such as a table top. The recess 120 houses the receiver coil $L_{Rx}$ 140 so that the receiver coil $L_{Rx}$ 140 is placed outside the enclosure 100 of the laptop 10. The receiver coil Ida 140 and the holding structure or frame 130 of the receiver coil $L_{Rx}$ 140 are placed in the recess 120 so that its height is shorter than the height of the recess 120 (i.e., the height of side walls of the recess 121). The coil 140 (when the top side of the recess includes the holding structure, .e.g., a material of a high magnetic permeability (e.g., $5\times10^{-5}$ H/m to $2.5\times10^{-2}$ H/m) or a coil ferrite) or the coil 140 and the holding structure 130 are spaced apart from the sidewalls 121 of the recess 120. In some embodiments, the recess 120 is located at a side of the enclosure 100 other than the bottom side no.

The receiver coil $L_{RX}$ 140 may sit directly on the top side 123 of the recess or is partially embedded in the top side 123 of the recess outside of the enclosure 100. The receiver coil $L_{Rx}$ 140 is located in a holding structure 130 and the holding structure 130 is directly attached to the top side 123 of the recess 120 or partially embedded in the top side 123 of the recess 120. The top side 123 of the recess 120 may comprise aluminum, copper, magnesium or another high conductive metal, and the holding structure 130 is formed from a material different than a metal, e.g., a material of a high magnetic permeability such as manganese zinc ferrite, nickel zinc ferrite, magnesium manganese zinc ferrite, cobalt nickel zinc ferrite or a coil ferrite. Directly attached may mean that there is no other metallic material between the coil 140/holding structure 130 and the top side 123 of the recess 120. In other words, the coil 140/holding structure 130 can be glued or otherwise fixed to the top side 123 of the recess 120.

The recess 120 is formed by a top side 123 having a continuous or substantially continuous plane and sidewalls 121. Either the top side 123 or the side walls 121 of the recess 120 or both may include holes for wires to and from the receiver coil $L_{RX}$ 140 advantageously allowing wireless power transfer while keeping EMI low. In some embodiments not only the enclosure 100 has holes for wires to and from the receiver coil $L_{RX}$ 140 but also the holding structure 130.

The recess 120 may be 40-70 mm wide, particularly 55-60 mm (e.g., 57 mm) wide, and the holding structure 130 of the receiver coil $L_{RX}$ 140 may be 30-55 mm wide, particularly 40-50 mm (e.g., 45 mm) wide. The holding structure 130 may have a height of 1-2 mm (e.g., 1.225 mm) and the recess may have a height of 2-3 mm (e.g., 1.5 mm).

In a bottom view, the recess or pocket 120 may have the form of a rectangle, square, oval or circle.

The recess or pocket may be produced by milling, welding or otherwise.

The receiver coil $L_{RX}$ 140 may be a single coil made from a wire wound once or several time in one layer or several layers. Alternatively, the receiver coil $L_{Rx}$ 140 comprises more than one coil (explained further below) made of more than one wire.

Figure 2B:
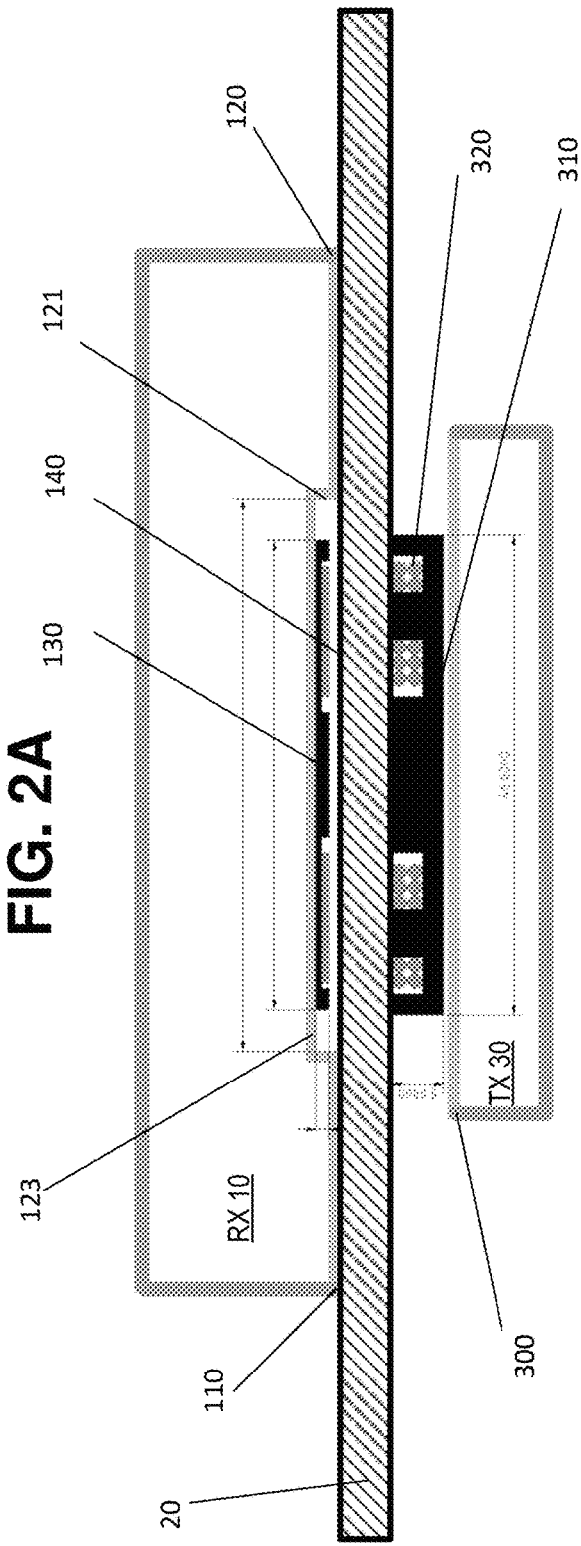
FIG. 2B shows a wireless charging system on a table top according to embodiments.

FIG. 2B shows a wireless charging system of a laptop 10 sitting on a flat surface structure such as a top side 22 of a table top 20 with a wireless charger 30 sitting on the bottom side 24 of the table top 20. The table top 20 may be wood, plastic or ceramic.

The wireless charger 30 comprises a plate or housing 300, a plurality of transmitting coils $L_{rx}$ 320 and a holding device or frame 310 holding the coils 320. The housing 300 may be of aluminum and the holding device 310 is a material other than aluminum, e.g., a material of a high magnetic permeability or a coil ferrite. In some embodiments, metals other than aluminum may be used for the housing 300.

The holding device 310 may be placed directly on the plate/housing 300 or may be attached to the plate/housing 300 with an adhesive 330 such as a glue. In a top view, the holding device 310 may have the form of a rectangle, a square, an oval or a circle and the transmitting coils $L_{rx}$ 320 may also have the form of a rectangle, a square, an oval or a circle. In some embodiments the transmitting coils $L_{rx}$ 320 may have a different form than the holding device 310. The transmitting coils $L_{rx}$ 320 may be concentric coils having a single center or focus when placed next to each other.

The holding device 310 or the transmitting coil $L_{TX}$ 320 with the largest radius/width of the wireless charger 30 may have a radius/width of 30-50 mm, particularly 40-50 mm (e.g., 46 mm) and a height of 3-7 mm, particularly 4-6 mm (e.g., 5 mm). There might be a small gap between the housing 300 and the holding device 310 of 0.1-0.2 mm provided by an adhesive such as a glue fixing the holding device 310 to the housing 300. The transmitting coil $L_{TX}$ 320 may be flat coils (e.g., one layer of windings).

Figure 3:
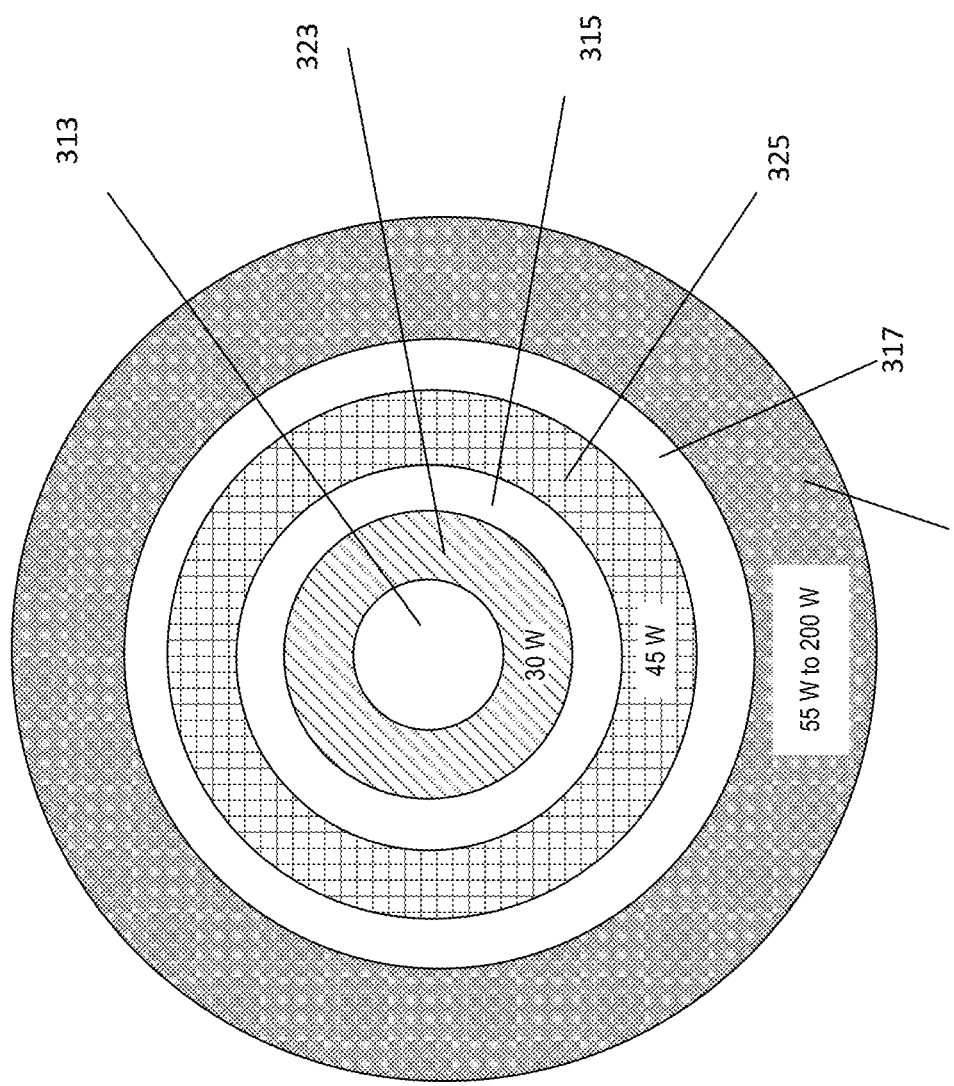
FIG. 3 shows a coil arrangement of a wireless power transmitter according to embodiments.

The wireless charger 30 may include a coil arrangement having three transmitting coils La 320. Of course the wireless charger 30 can have less than three, i.e., two transmitting coils $L_{TX}$ 320, or more than three transmitting coils $L_{rx}$ 320 such as four, five or six transmitting coils $L_{TX}$ 320. As shown in FIG. 3, the transmitting coils $L_{TX}$ 320 may be circular coils. The first coil 323 is the inner coil, the second coil 325 is the middle coil and the third coil 327 is the outer coil. The radius of the third coil 327 is larger than the radius of the second coil 325 and the radius of this coil 325 is larger than the radius of the first coil 323. As will be discussed further below, the transmitting coils $L_{rx}$ 320 may provide different power outputs. The coil configured to provide the highest power output (e.g., coil 327) may have equal or more coil windings or turns than the coil configured to provide a middle power output (e.g., coil 323) and the middle power output coil may have equal or more windings than the coil configured to provide the lowest power output (e.g., 325). Walls or protrusions 313, 315, 317 of the holding device 310 separate the transmitting coils $L_{TX}$ coils 323-327.

Figure 4:
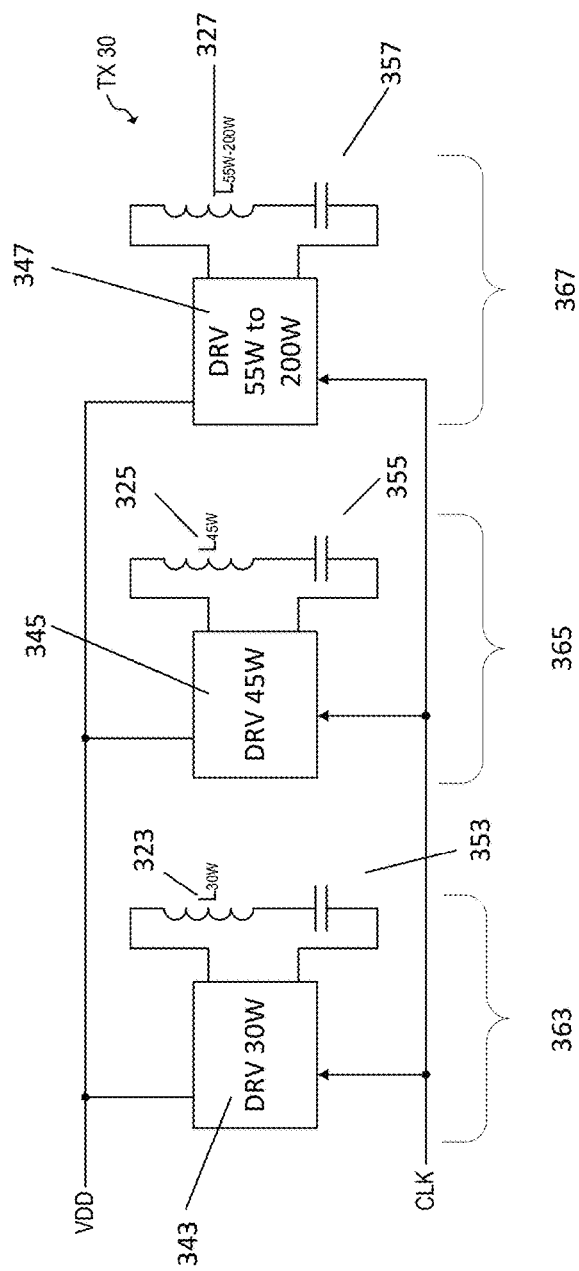
FIG. 4 shows a transmitter arrangement of a wireless power transmitter according to embodiments.

Each transmitting coils $L_{TX}$ 323-327 is driven by its own independent driver circuit 343-347 located in the housing 300 of the wireless charger 30. This is shown in FIG. 4. Each transmitter 363-367 comprises a driver circuit 343-347 and a respective LC tank 353-357. Corresponding to the transmitting coils $L_{Tx}$ 320, the first transmitter 363 comprises a first driver circuit 343 with a first LC tank 353, the second transmitter 365 comprises a second driver circuit 345 with a second LC tank 355 and the third transmitter 367 comprises a third driver circuit 347 with a third LC tank 357.

The driver circuits 343-347 may be implemented in any way known in the art. For example, in some embodiments, driver circuits 343-347 may be implemented with a half bridge. In other embodiments, a full bridge may be used. In some embodiments, the driver circuits 343-347 may be implemented as a class-D amplifier or a class-E amplifier. Other implementations are also possible.

Each driver circuit 343-347 is controlled by a controller configured to set the operating frequency of the driver circuit 343-347 such that a desired target voltage across the coil 323-327 is generated in order to generate the desired power transfer while operating away from the resonance frequency of the individual wireless power transmitter 363-367. For example, each wireless power transmitter 363-367 performs a frequency sweep across an operating frequency range that does not include the resonance frequency of the wireless power transmitter 363-367. In some embodiments, the controller performs the frequency sweep by controlling the driver circuit 343-347. Each driver circuit 343-347 may have an integrated controller or an individually assigned controller that is not part of the driver circuit 343-347.

The drive circuits 343-347 are connected to a power supply VDD and a clock signal line CLK. In some embodiments, a switch such as a blocking field effect transistor (FET) is used between the power supply VDD and the input of each driver circuit 343-347 to prevent power going back to the supply VDD. The blocking FET is off when the driver circuit 343-347 is not delivering power and is on when the driver is delivering power.

The first transmitter 363 is configured to provide a first power, e.g., in a range from 0 W to 30 W, the second transmitter 365 is configured to provide a second power, e.g., in a range from 0 W to 15 W and the third transmitter 367 is configured to provide a third power, e.g., in a range from 10 W to 155 W. The transmitters 363-367 can be individually driven so that they together provide a maximal transmit power of 200 W in this example. Other combinations of power transmitters with different maximal power outputs are also possible. Each transmitting coil $L_{TX}$ 320 is configured to provide a certain magnetic field and since each transmitting coil $L_{TX}$ 320 can be independently driven the overall magnetic field can have different forms, shapes and intensity curves depending on how the individual transmitting coils $L_{rx}$ 320 are driven. The magnetic field and the intensity curves may be shaped based on the magnitude of the current flowing through each transmitting coil $L_{TX}$ 320, the magnitude of the change of current through each transmitting coil $L_{TX}$ 320 and the frequency of the current in each transmitting coil $L_{rx}$ 320.

Figure 5:
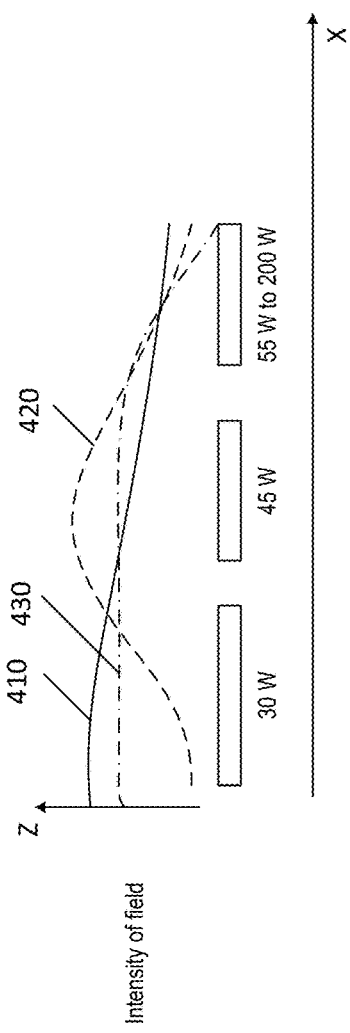
FIG. 5 shows different intensity curves generated by a wireless power transmitter according to embodiments.

FIG. 5 shows three exemplary intensity curves of magnetic fields in a z-direction (towards a power receiver of the laptop 100) along an x-direction. The wireless charger 30 is able to generate a customized magnetic field and an intensity curves having different forms and shapes. For example, the first intensity curve 410 (solid line) is formed by driving each coil 323-327 in each transmitter 363-367 so that all transmitters 363-367 contribute to the overall intensity. The second intensity curve 420 (dashed line) is generated by driving mainly the second coil 325 and barley or not the first and second coils 323, 327 while the third intensity curve 430 (dashed line with dots) is generated by driving the first and the second coils 325, 325 but not the third coil 327. In some embodiments, when the outer coil 327 is transmitting power, all inner coils 323, 325 are also transmitting power. In further embodiments, the transmitter 30 may be set to a low power setting (e.g., first and may be second transmitters 363, 365 are transmitting) and a high power setting (e.g., all transmitters 363-367 are transmitting). Many other magnetic fields and intensity curves can be generated.

Referring back to FIG. 2B, in some embodiments, the transmitting coils $L_{rx}$ 320 may be three coils while the receiver coil $L_{Rx}$ coil 140 is just a single coil. Moreover, the transmitting coils $L_{rx}$ 320 may be of a different size than the receiver coil $L_{RX}$ coil 140. For example, in some applications, the transmitting coils $L_{TX}$ 320 may be substantially wider than the receiver coil $L_{Rx}$ coil 140. In some applications, using transmitting coils $L_{RX}$ 320 that are substantially wider than the receiver coil $L_{Rx}$ coil 140 may result in substantial power being dissipated in the metallic enclosure 100. Shaping the magnetic field and the intensity of the field of the transmitting coils $L_{TX}$ 320 towards the (smaller) receiver coil $L_{RX}$ coil 140 and away from the enclosure 100 may improve the transmission efficiency and advantageously keeps the transmission safe, e.g., does not substantially heat up the metallic enclosure 100.

Figure 6:
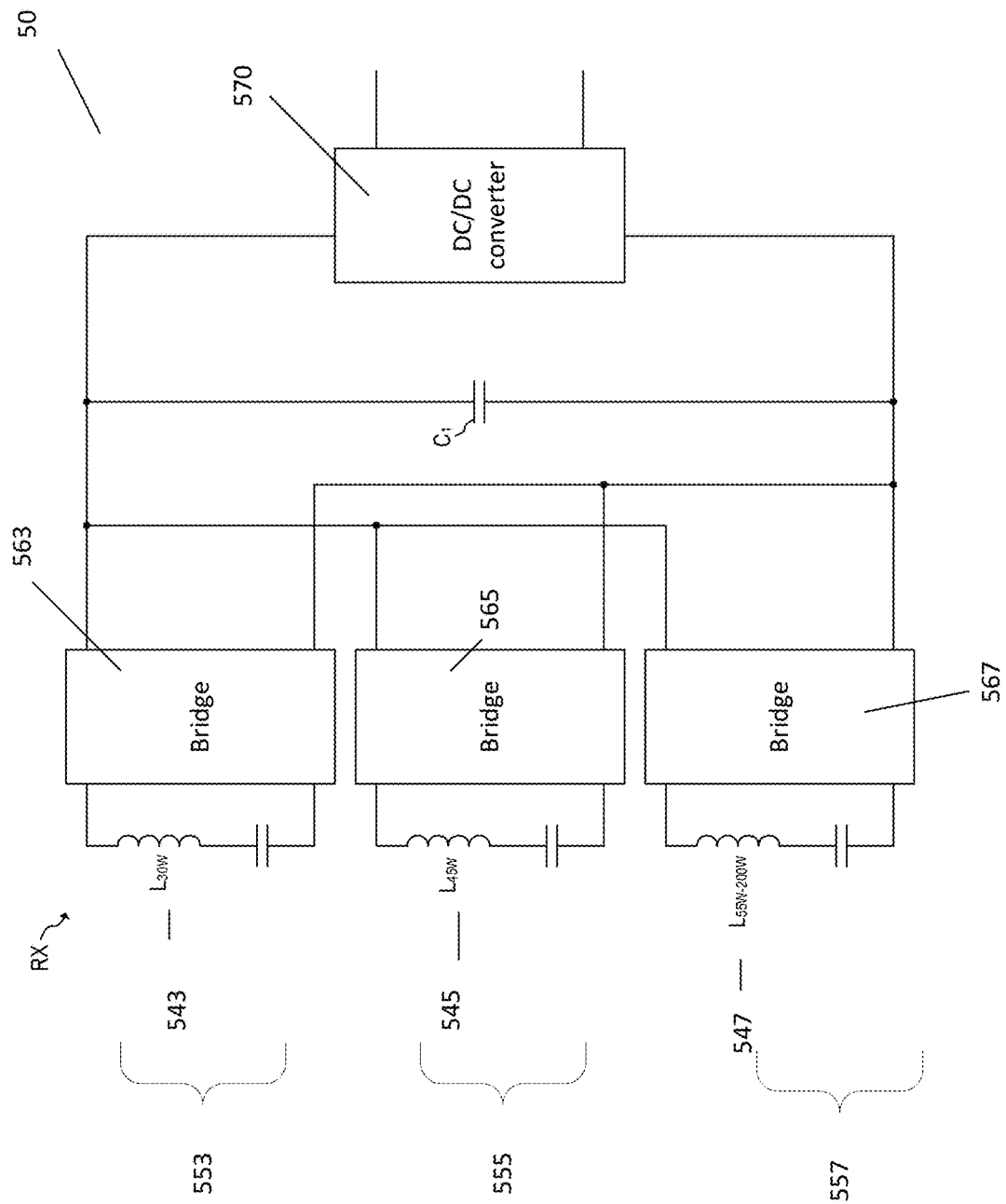
FIG. 6 shows a receiver arrangement of a wireless power receiver according to embodiments.

FIG. 6 shows an example of a receiver RX 50. The receiver RX 50 may include a coil arrangement of three coils 543-547 similar to those shown in FIG. 3 but on the receiver side. The receiver RX 50 may have more or less than three coils on the receiver side, i.e., two coils or four, five, six or more coils. Each coil 543-547 is connected via separate LC tank 553-557 to a separate bridge 563-567 and the bridges 563-567 are connected in series to a DC/DC converter 570. A filtering capacitor Ci may be arranged before the DC/DC converter 570. A more detailed arrangement for the receiver path is shown in FIG. 7.

Figure 7:
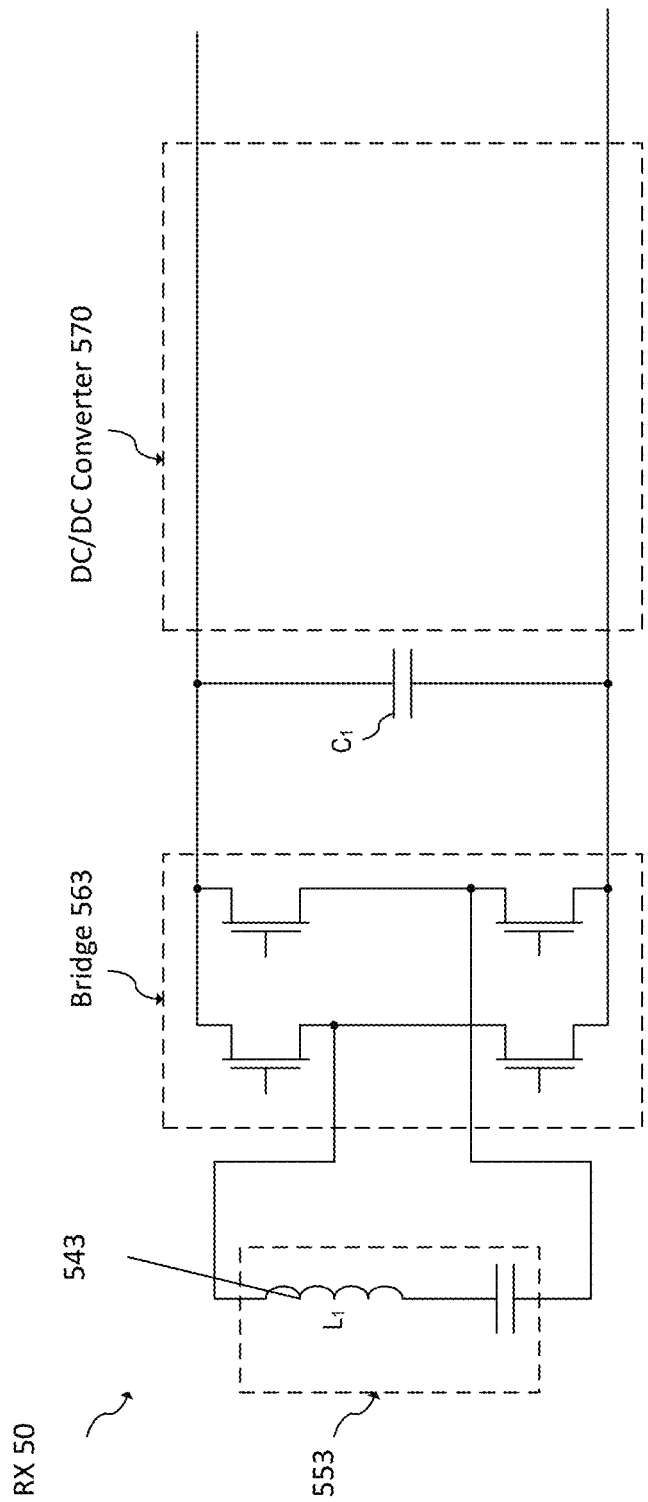
FIG. 7 shows a receiver path of a receiver arrangement of a wireless power receiver according to embodiments.

FIG. 7 shows a portion of receiver RX 50, i.e., one of the receiver path of the receiver RX 50. The receiver path includes the LC tank 553 with a first coil 543 connected to a (synchronous) rectifier bridge 563. The rectifier bridge 563 is connected to a filtering capacitor Ci, and a DC/DC converter 570 such as a boost or buck-boost. Receiver RX 50 includes more than one receiver path, e.g., two, three or more of these individual paths, for each receive coil 543-547 one.

During wireless power transmission (charging), power is received by each of three LC tanks 553-557 and is rectified by the respective current-based bridge 563-567. The bridges are controlled by a master controller (not shown) that controls, coordinates and synchronizes them. The master controller controls the bridges 563-567 so that bridges 563-567 operate in a current sharing mode, e.g., that the current provided to the bridge 563-567 is added up and provided to the DC/DC converter 570. The controller may change the phase (switching angle) for each bridge 563-567 to allow more or less current flow through the individual bridge 563-567. This advantageously makes sure that high amount of power can be received without overheating the (individual) bridges 563-567.

In some embodiments, the transmitter TX 30 and the receiver RX 50 negotiate which coils will be used prior to beginning wireless power transfer.

Communication between the receiver RX 50 and the transmitter TX 30 is an important aspect of wireless charging. Conventional communication may be performed by, e.g., load modulation at 1 kHz to 2 kHz. However, such communication may be prone to hacking. For example, a malicious app may turn on and off a processor of a phone to cause it to consume spikes of currents at the 1 kHz to 2 kHz in a manner such as to indicate to the TX 30 to increase power. Such method may allow an app to create a dangerous condition, such as burning or substantially damage a device. Load transients can also disturb the communication.

Therefore, communication may be provided by a higher frequency in-band or by out of band communication. In-band communication done at higher frequencies (e.g., cycle by cycle signaling in patent application Ser. No. 17/020,494 which application is incorporated herein by reference in its entirety) is isolated from the load by the DC filtering capacitor C, at the output of the rectifier 563-567. This capacitor C, can filter high frequency load transients but cannot filter 1 or 2 kHz load transients. Out of band communication can be provided by wireless communication or Bluetooth communication.

Example embodiments of the present invention are summarized here. Other embodiments can also be understood from the entirety of the specification and the claims filed herein.

Example 1: An electronic device includes a metal housing including electronic components of the electronic device; a recess in the metal housing; a receiver coil configured to receive wireless power, the receiver coil located in the recess outside of the metal housing; and a holding structure for the receiver coil, where the holding structure includes a material with a high magnetic permeability, and where the receiver coil is electrically connected to the electronic components inside the metal housing.

Example 2: The electronic device according to example 1, where the material with the high magnetic permeability is ferrite and a metal of the metal housing is aluminum.

Example 3: The electronic device according to one of examples 1 or 2, where the recess has a top side and side walls, and where the holding structure is directly located on the top side of the recess.

Example 4: The electronic device according to one of examples 1 to 3, where the recess has a top side and side walls, and where the receiver coil is connected via the top side to the electronic components inside of the metal housing.

Example 5: The electronic device according to one of examples 1 to 4, where the receiver coil includes more than one receiver coil and the coils are concentric coils.

Example 6: The electronic device according to one of examples 1 to 5, where each receiver coil is connected to an individually assigned bridge, and where the individual bridges are serially connected to a DC/DC converter.

Example 7: The electronic device according to one of examples 1 to 6, further including a controller configured to control the bridges so that each bridge has a different switching angle.

Example 8: The electronic device according to one of examples 1 to 7, where the controller is configured to control a current flow through each bridge so that the bridges do not overheat.

Example 9: The electronic device according to one of examples 1 to 8, where the electronic device is a laptop Example 10: The electronic device according to one of examples 1 to 9, where the recess is located on a side of the laptop on which the laptop is configured to be placed.

Example 11: A wireless charger includes a first concentric coil of a first LC tank; a second concentric coil of a second LC tank; a first driver circuit electrically connected the first LC tank; and a second driver circuit electrically connected to the second LC tank, where the first driver circuit is independently and separately connected to the first LC tank, where the second driver circuit is independently and separately connected to the second LC tank, where the first concentric coil is located within the second concentric coil, and where the wireless charger is configured to transmit electrical power.

Example 12: The wireless charger according to example 11, where the first concentric coil is configured to transmit a first electrical power, where the second concentric coil is configured to transmit a second electrical power, and where the second electrical power is higher than the first electrical power.

Example 13: The wireless charger according to one of examples 11 or 12, further including a third concentric coil of a third LC tank electrically connected to a third driver circuit, where the third driver circuit is independently and separately connected to the third LC tank, and where the first concentric coil is located within the second concentric coil and the second concentric coil is located within the third concentric coil.

Example 14: The wireless charger according to one of examples 11 to 13, where the first concentric coil is configured to transmit a first electrical power, where the second concentric coil is configured to transmit a second electrical power, where the third concentric coil is configured to transmit a third electrical power, where the third electrical power is higher than the first and second electrical powers, and where the first electrical power is higher than the second electrical power.

Example 15: The wireless charger according to one of examples 11 to 14, where the wireless charger is configured to always transmit electrical power via the first concentric coil when wireless power is transmitted.

Example 16: The wireless charger according to one of examples 11 to 15, where the first and second concentric coils are configured to transmit electrical power when the third concentric coil is configured to transmit electrical power.

Example 17: A wireless charging system includes a wireless power transmitter including: a first concentric coil of a first LC tank; a second concentric coil of a second LC tank; a first driver circuit electrically connected the first LC tank; and a second driver circuit electrically connected to the second LC tank, where the first driver circuit is independently and separately connected to the first LC tank, where the second driver circuit is independently and separately connected to the second LC tank, and where the first concentric coil is located within the second concentric coil; and a wireless power receiver including a coil, where the wireless power transmitter is configured to transmit electrical power to the wireless power receiver.

Example 18: The wireless charging system according to example 17, where the wireless power receiver is a part of an electronic device that is protected by an electromagnetic interference (EMI) housing, where a radius of the first and second concentric coils is larger than a radius of the coil, and where the wireless power transmitter is configured to shape an intensity of a magnetic field towards the coil and away from the housing.

Example 19: The wireless charging system according to one of examples 17 or 18, further including a flat surface structure located between the wireless power transmitter and the wireless, power receiver.

Example 20: The wireless charging system according to one of examples 17 to 19, where the flat surface structure is a table top.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic device comprising:
a metal housing comprising electronic components of the electronic device;
a recess in the metal housing;
a receiver coil configured to receive wireless power, the receiver coil located in the recess outside of the metal housing; and
a holding structure for the receiver coil,
wherein the holding structure comprises a material with a high magnetic permeability, and
wherein the receiver coil is electrically connected to the electronic components inside the metal housing.

2. The electronic device according to claim 1, wherein the material with the high magnetic permeability is ferrite and a metal of the metal housing is aluminum.

3. The electronic device according to claim 1, wherein the recess has a top side and side walls, and wherein the holding structure is directly located on the top side of the recess.

4. The electronic device according to claim 1, wherein the recess has a top side and side walls, and wherein the receiver coil is connected via the top side to the electronic components inside of the metal housing.

5. The electronic device according to claim 1, wherein the receiver coil comprises more than one receiver coil and the coils are concentric coils.

6. The electronic device according to claim 5, wherein each receiver coil is connected to an individually assigned bridge, and wherein the individual bridges are serially connected to a DC/DC converter.

7. The electronic device according to claim 6, further comprising a controller configured to control the bridges so that each bridge has a different switching angle.

8. The electronic device according to claim 7, wherein the controller is configured to control a current flow through each bridge so that the bridges do not overheat.

9. The electronic device according to claim 1, wherein the electronic device is a laptop.

10. The electronic device according to claim 9, wherein the recess is located on a side of the laptop on which the laptop is configured to be placed.

* * * * *